United States Patent
Itokawa et al.

(10) Patent No.: US 10,636,807 B2
(45) Date of Patent: Apr. 28, 2020

(54) SEMICONDUCTOR MEMORY DEVICE AND METHOD OF FABRICATING THE SAME

(71) Applicant: TOSHIBA MEMORY CORPORATION, Minato-ku, Tokyo (JP)

(72) Inventors: Hiroshi Itokawa, Kuwana Mie (JP); Takashi Furuhashi, Kuwana Mie (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 4 days.

(21) Appl. No.: 15/910,703

(22) Filed: Mar. 2, 2018

(65) Prior Publication Data

US 2019/0088675 A1 Mar. 21, 2019

(30) Foreign Application Priority Data

Sep. 15, 2017 (JP) ................................. 2017-178221

(51) Int. Cl.
*H01L 27/11582* (2017.01)
*H01L 29/51* (2006.01)
*H01L 21/28* (2006.01)
*H01L 29/792* (2006.01)

(52) U.S. Cl.
CPC .. *H01L 27/11582* (2013.01); *H01L 29/40117* (2019.08); *H01L 29/517* (2013.01); *H01L 29/513* (2013.01); *H01L 29/7926* (2013.01)

(58) Field of Classification Search
CPC ........... H01L 27/11582; H01L 27/1157; H01L 27/11556; H01L 29/7926; H01L 29/517; H01L 29/513; H01L 29/4234; H01L 21/28282; H01L 29/40117
See application file for complete search history.

(56) References Cited

U.S. PATENT DOCUMENTS

| | | | |
|---|---|---|---|
| 7,947,582 B2* | 5/2011 | Hautala | H01L 29/7881 438/515 |
| 8,907,397 B2 | 12/2014 | Yasuda | |
| 9,287,288 B2 | 3/2016 | Yasuda et al. | |
| 9,406,693 B1* | 8/2016 | Pang | H01L 27/11582 |

(Continued)

OTHER PUBLICATIONS

Maikap et al., "HfO$_2$/HfAlO/HfO$_2$ Nanolaminate Charge Trapping Layers for High-Performance Nonvolatile Memory Device Applications," Japanese Journal of Applied Physics, vol. 46, No. 4A, 2007, pp. 1803-1807.

*Primary Examiner* — Michael M Trinh
(74) *Attorney, Agent, or Firm* — Foley & Lardner LLP (57) ABSTRACT

A semiconductor memory device includes a stacked body, a semiconductor portion, a first insulating film, a charge storage layer, and a second insulating film. The stacked body has a plurality of electrode layers stacked in a spaced apart manner from each other. The semiconductor portion is provided in the stacked body and extends in a first direction where the plurality of electrode layers are stacked. The first insulating film is provided between the plurality of electrode layers and the semiconductor portion. The charge storage layer is provided between the plurality of electrode layers and the first insulating film and contains a compound including at least one of hafnium oxide or zirconium oxide and a first material having a valence lower than that of the at least one of the hafnium oxide or the zirconium oxide.

14 Claims, 10 Drawing Sheets

(56) References Cited

U.S. PATENT DOCUMENTS

| | | |
|---|---|---|
| 9,437,607 B2 | 9/2016 | Park et al. |
| 9,449,985 B1 * | 9/2016 | Rabkin ............. H01L 21/28282 |
| 2016/0240556 A1 * | 8/2016 | Morota ................. H01L 29/513 |
| 2016/0269668 A1 * | 9/2016 | Oshiyama ......... H01L 27/14623 |

* cited by examiner

SEMICONDUCTOR MEMORY DEVICE AND METHOD OF FABRICATING THE SAME

CROSS-REFERENCE TO RELATED APPLICATION

This application claims the benefit of and priority to Japanese Patent Application No. 2017-178221, filed Sep. 15, 2017, the entire contents of which are incorporated herein by reference.

FIELD

Embodiments described herein relate generally to a semiconductor memory device and a method of fabricating the same.

BACKGROUND

A semiconductor memory device having a three-dimensional structure is proposed in which a memory hole is formed in a stacked body in which a plurality of electrode layers are stacked and a charge storage layer and a channel are provided in the memory hole. The charge storage layer has a function of trapping charges in the layer, the charges are transferred between the charge storage layer and the channel, and thus a write operation and an erasing operation are performed. However, improvements in miniaturization and operation characteristics of a memory cell in such a semiconductor memory device still remain desired.

DETAILED DESCRIPTION

In a semiconductor memory device having a three-dimensional structure, the thickness of the charge storage layer is made thin, and thus the memory cell is miniaturized, whereby the number of memory cells can be increased. On the other hand, since the number of charges to be trapped in the charge storage layer depends on the film thickness, when the charge storage layer is formed thin, the charges may be hardly trapped in the charge storage layer and operation characteristics of the memory cell may deteriorate.

Exemplary embodiments provide a semiconductor memory device with improved memory cell characteristics and a method of fabricating the same.

In general, according to some embodiments, a semiconductor memory device includes a stacked body, a semiconductor portion, a first insulating film, a charge storage layer, and a second insulating film. In some embodiments, the stacked body has a plurality of electrode layers stacked apart from each other. The semiconductor portion may be provided in the stacked body and extend in a first direction where the plurality of electrode layers are stacked. The first insulating film may be provided between the plurality of electrode layers and the semiconductor portion. The charge storage layer may be provided between the plurality of electrode layers and the first insulating film and contain a compound including at least one of hafnium oxide or zirconium oxide and a first material having a valence lower than that of at least one of the hafnium oxide or the zirconium oxide. The second insulating film may be provided between the plurality of electrode layers and the charge storage layer.

Exemplary embodiments of the present disclosure will be described with reference to the drawings.

The drawings are schematic or conceptual; and the relationships between the thicknesses and widths of portions, the proportions of sizes between portions, etc., are not necessarily the same as the actual values thereof. Further, the dimensions and/or the proportions may be illustrated differently between the drawings, even in the case where the same portion is illustrated.

In the drawings and the specification of the application, the same reference numerals are given to the same elements as those described above with reference to the preceding drawings, and a detailed description will be omitted as appropriate.

Figure 1:
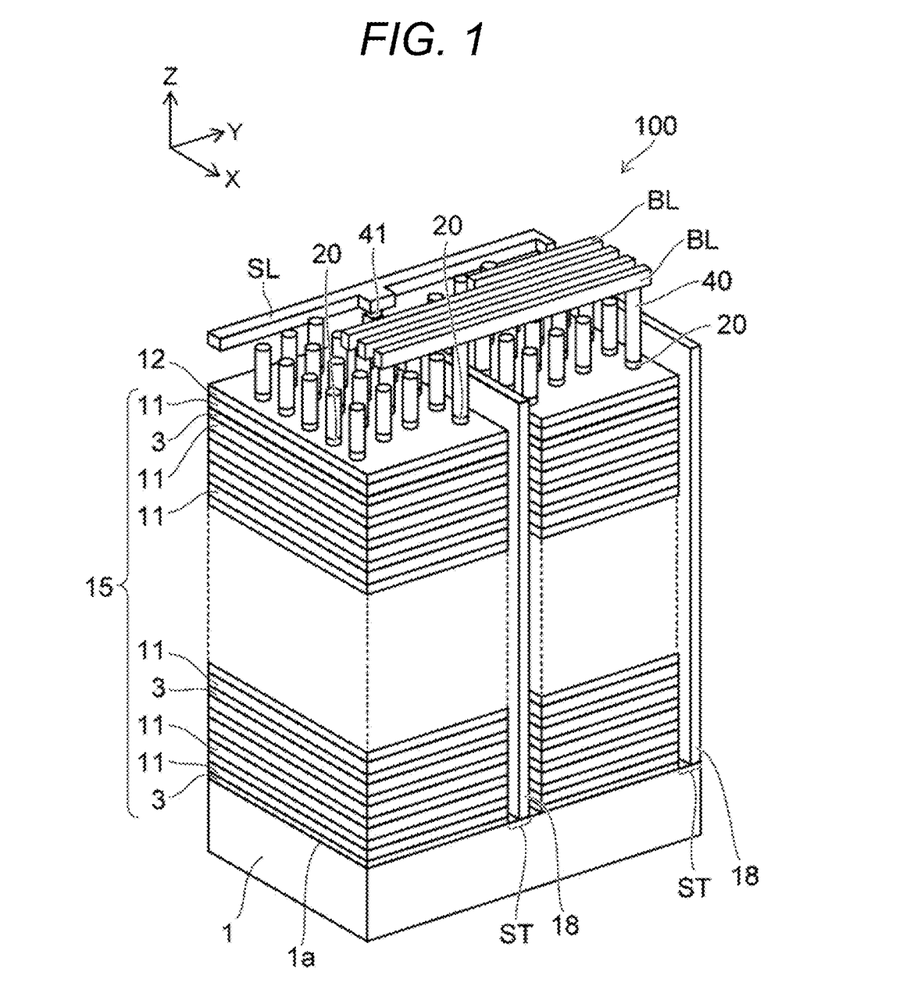
FIG. 1 is a perspective view illustrating a semiconductor memory device according to a first embodiment.
Figure 2:
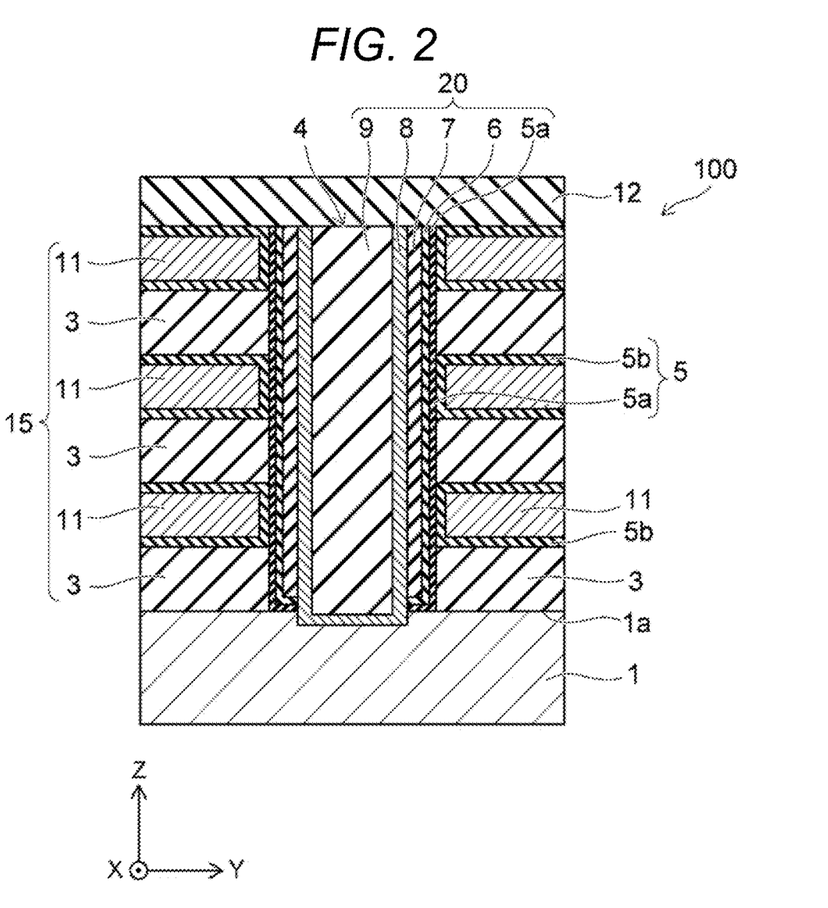
FIG. 2 is a cross-sectional view illustrating the semiconductor memory device according to the first embodiment.

FIG. 1 is a perspective view of a semiconductor memory device 100 according to the first embodiment. FIG. 2 is a cross-sectional view of the semiconductor memory device 100 according to the first embodiment.

As illustrated in FIG. 1 and FIG. 2, the semiconductor memory device 100 is provided with a semiconductor substrate 1.

In the present disclosure, an X direction and a Y direction are directions parallel to an upper surface 1a of the semiconductor substrate 1 and are orthogonal to each other. A Z direction is a direction orthogonal to both the X direction and the Y direction. FIG. 2 illustrates a Y-Z cross section of the semiconductor memory device 100.

Referring to FIG. 1, the semiconductor memory device 100 includes a stacked body 15, a columnar portion 20, and an interconnection portion 18.

The stacked body 15 is provided on the semiconductor substrate 1. The semiconductor substrate 1 may contain, for example, silicon (Si).

The stacked body 15 includes a plurality of electrode layers 11 and a plurality of insulating layers 3. For example, the electrode layer 11 may contain a metal such as tungsten (W). The electrode layer 11 may be provided with a main body made of, for example, tungsten and a barrier metal layer made of, for example, titanium nitride (TiN) and covering a surface of the main body. The insulating layer 3 may contain silicon oxide (SiO), for example. The insulating layer 3 may be an interlayer insulating layer provided between the electrode layers 11. The number of electrode layers 11 in the stack is arbitrary.

Referring to FIG. 2, the stacked body 15 is provided with a memory hole 4. On the stacked body 15, an insulating layer 12 containing silicon oxide or the like may be provided.

The columnar portion 20 is provided in the stacked body 15 so as to be located in the memory hole 4. The columnar portion 20 extends in the Z direction in the stacked body 15. The columnar portion 20 may be formed in, for example, a circular columnar shape or an oval columnar shape. As illustrated in FIG. 2, the columnar portion 20 includes a core film 9, a channel film 8, a tunnel film 7, a charge storage layer 6, and a block film 5a.

The core film 9 may contain, for example, silicon oxide. The core film 9 may be formed in, for example, a circular columnar shape. In some embodiments, the columnar portion 20 does not include the core film 9.

The channel film 8 may be provided so as to cover an outer periphery of the core film 9. The channel film 8 may be a semiconductor portion and may contain silicon, for example, polysilicon obtained by crystallizing amorphous silicon. The channel film 8 may be formed in, for example, a bottomed cylindrical shape. The channel film 8 may be formed of two layers.

As illustrated in FIG. 2, a lower end of the channel film 8 is in contact with the semiconductor substrate 1. As illustrated in FIG. 1, an upper end of the channel film 8 is connected to contacts 40 provided in the insulating layer 12. Thus, the channel film 8 (see FIG. 2) is connected to bit lines BLs via the contacts 40 (see FIG. 1).

As illustrated in FIG. 2, the tunnel film 7 is provided along a side surface of the channel film 8. The tunnel film 7 may be an insulating film, which is, for example, a stacked film of a film containing silicon nitride (SiN) and a film containing silicon oxide. In the case of forming the tunnel film 7 with the stacked film, the tunnel film 7 may be formed by a band-gap operation, for example. The tunnel film 7 may be formed in, for example, a circular cylindrical shape.

The tunnel film 7 may be a potential barrier between the charge storage layer 6 and the channel film 8. At the time of writing, electrons may be tunneled from the channel film 8 to the charge storage layer 6 through the tunnel film 7, whereby information is written. At the time of erasing, positive holes may be tunneled from the channel film 8 to the charge storage layer 6 through the tunnel film 7 to cancel out charges of the electrons, whereby the stored information is erased.

As illustrated in FIG. 2, the charge storage layer 6 is provided along a side surface of the tunnel film 7. The charge storage layer 6 may contain, for example, hafnium oxide (HfO) and a material having a valence lower than that of hafnium (Hf). The charge storage layer 6 may contain, for example, zirconium oxide (ZrO) and a material having a valence lower than that of zirconium (Zr). In the following description, hafnium oxide (HfO) and a material having a valence lower than that of hafnium (Hf) will be mainly described. Since hafnium and zirconium are elements belonging to the same group and have similar properties, the same description applies to zirconium oxide (ZrO) and a material having a valence lower than that of zirconium (Zr).

Examples of the material having the valence lower than that of hafnium or zirconium (hereinafter referred to as a low valence material) may include aluminum (Al), yttrium (Y), scandium (Sc), lanthanum (La), praseodymium (Pr), gadolinium (Gd), dysprosium (Dy), ytterbium (Yb), or lutetium (Lu). In the present disclosure, the valence refers to the oxidation number. Here, the low valence means that the number of bondable atoms (for example, oxygen atoms) is small compared to hafnium or zirconium. The valence of hafnium is 4, the valence of zirconium is 4, and the valence of aluminum is 3. Due to the different oxidation number, for example, oxygen may be exchanged in a hafnium oxide film, and oxygen vacancy defects, which can be charge trapping sites, may increase.

The charge storage layer 6 may be formed in, for example, a circular cylindrical shape. A memory cell including the charge storage layer 6 may be formed at an intersection between the channel film 8 and the electrode layer 11. The charge storage layer 6 may have trap sites for trapping charges in the layer. A threshold voltage of the memory cell may vary depending on the presence or absence of the charges trapped in the trap sites and the amount of trapped charges. Thus, the memory cell stores information.

As illustrated in FIG. 2, the block film 5a is provided on a side surface of the charge storage layer 6. The block film 5a may be an insulating film and may contain silicon oxide, for example. The block film 5a may be formed in, for example, a circular cylindrical shape. The block film 5a may protect the charge storage layer 6 from etching at the time of formation of the electrode layer 11.

As illustrated in FIG. 2, a block film 5b is provided on a side surface of the block film 5a. Further, the block film 5b is provided between the semiconductor substrate 1 and the electrode layer 11 and between the electrode layer 11 and the insulating layer 3. The block film 5b may be an insulating film and may contain aluminum oxide (AlO), for example. The block film 5b may contain at least one of zirconium oxide, hafnium oxide, or lanthanum oxide (LaO).

As illustrated in FIG. 2, the block film 5a and the block film 5b form the block film 5.

As illustrated in FIG. 1, the interconnection portion 18 is provided in a slit ST formed in the stacked body 15. A lower end of the interconnection portion 18 is located on the semiconductor substrate 1. An upper end of the interconnection portion 18 is connected to a source line SL via a contact 41.

In the semiconductor memory device 100, a large number of memory cells including the charge storage layer 6 may be arranged in a three-dimensional lattice shape in the X direction, the Y direction, and the Z direction, and each of the memory cells can store data.

Next, characteristics of the charge storage layer 6 will be further described.

Figure 3:
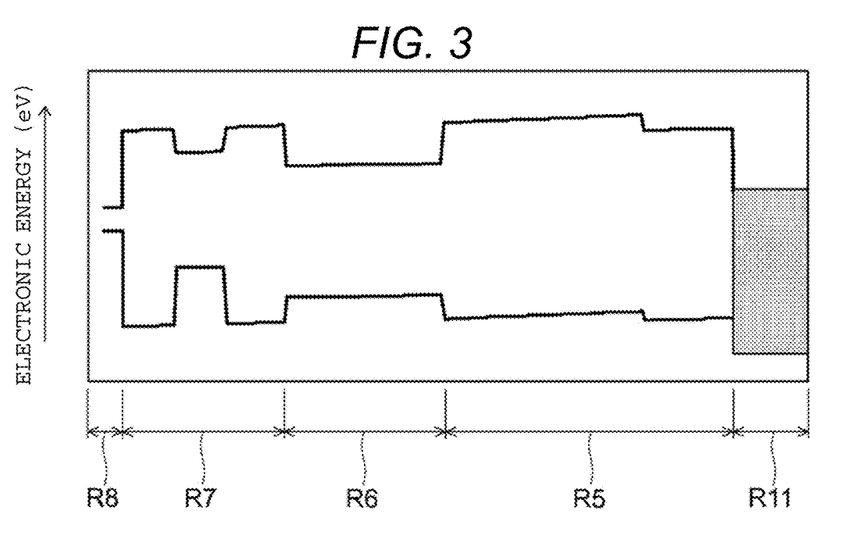
FIG. 3 is a view illustrating characteristics of the semiconductor memory device according to the first embodiment.

FIG. 3 is a view illustrating an energy band of the semiconductor memory device 100 according to the first embodiment.

In FIG. 3, a vertical axis represents electron energy (eV), and a horizontal axis represents formation regions of elements. In FIG. 3, the horizontal axis represents a region R8 in the Y direction of the channel film 8, a region R7 in the Y direction of the tunnel film 7, a region R6 in the Y direction of the charge storage layer 6, a region R5 in the Y direction of the block film 5, and a region R11 in the Y direction of the electrode layer 11. That is, the channel film 8, the tunnel film 7, the charge storage layer 6, and the block film 5 are located in this order as being close to the electrode layer 11. The vertical axis represents corresponding valence bands of the channel film 8, the tunnel film 7, the charge storage layer 6, the block film 5, and the electrode layer 11.

In an example illustrated in FIG. 3, the channel film 8 contains silicon, the tunnel film 7 contains silicon nitride and silicon oxide, the charge storage layer 6 contains hafnium aluminate (HfAlO) obtained by adding aluminum to hafnium oxide, and the block film 5 (block films 5a and 5b) contains silicon oxide and aluminum oxide.

According to the band structure illustrated in FIG. 3, since an upper end of the valence band of the charge storage layer 6 is lower than that of the tunnel film 7, the energy of the injected positive holes increases in the erasing operation, and migration tends to occur, so erasing efficiency is improved.

Figure 4:
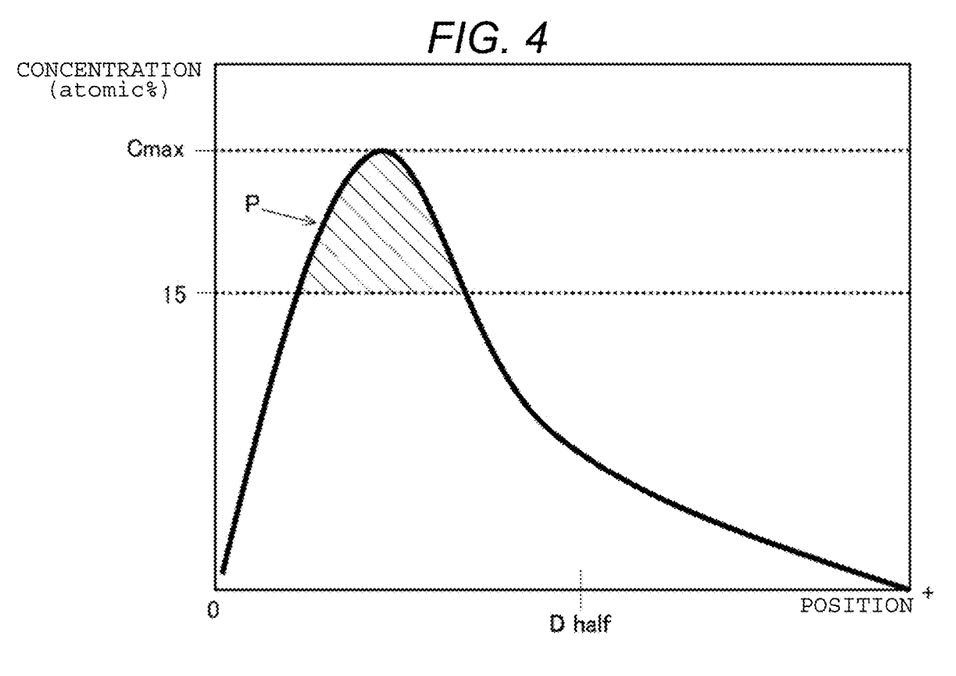
FIG. 4 is a graph illustrating characteristics of the semiconductor memory device according to the first embodiment.

FIG. 4 illustrates concentration distribution of the low valence material contained in the charge storage layer 6 of the semiconductor memory device 100 according to the first embodiment.

In FIG. 4, a vertical axis represents a concentration (atomic %) of the low valence material contained in the charge storage layer 6, and a horizontal axis represents a position in the Y direction in the charge storage layer 6 with respect to the tunnel film 7. In the horizontal axis of FIG. 4, as the position approaches a plus (+) side, the position in the Y direction in the charge storage layer 6 moves away from the tunnel film 7 and approaches the block film 5a. On the other hand, as the position approaches zero (0), the position in the Y direction in the charge storage layer 6 moves away from the block film 5a and approaches the tunnel film 7.

In an example illustrated in FIG. 4, the channel film 8 contains silicon, the tunnel film 7 contains silicon nitride and silicon oxide, the charge storage layer 6 contains hafnium aluminate obtained by adding aluminum to hafnium oxide, and the block film 5 (block films 5a and 5b) contains silicon oxide and aluminum oxide.

According to the concentration distribution illustrated in FIG. 4, a peak distribution P has a concentration of aluminum, which is a low valence material in the charge storage layer 6, of 15 (atomic %) or more and a maximum aluminum concentration Cmax, and is located on the side of the tunnel film 7. Here, the peak distribution P is a hatched portion, and a position Dhalf corresponds to a half-thickness position of the charge storage layer 6 in the Y direction. That is, FIG. 4 illustrates that the peak distribution P is located closer to the tunnel film 7 than the position Dhalf. In the first embodiment, aluminum is added to the hafnium oxide so as to have such a peak distribution P, whereby the charge storage layer 6 is formed.

As illustrated in FIG. 4, the peak distribution P of the concentration is located closer to the tunnel film 7 than the position Dhalf, and thus erasing efficiency is improved. The reason is that during the erasing operation, positive holes are tunneled from the tunnel film 7 toward the charge storage layer 6, but electrons trapped in a shallow level are drawn out. At this time, since the electrons may be trapped at the peak position of the concentration, the peak distribution P is preferably located on the side of the tunnel film 7. Further, since the concentration of the low valence material of the peak distribution P is 15 atomic % or more, the injected positive holes drift to recombine the electrons trapped on the side of the tunnel film 7 of the charge storage layer 6 without energy loss, whereby erasing efficiency is improved.

In the example illustrated in FIG. 4, the charge storage layer 6 is formed in such a manner that the aluminum is added to the hafnium oxide so as to have one peak distribution P, but may be formed by any manner in some embodiments. The charge storage layer 6 may be formed in such a manner that the aluminum is added to the hafnium oxide so as to have two or more peak distributions P. For example, when peak distributions P1 and P2 are respectively formed on sides of the tunnel film 7 and the block film 5 based on the position Dhalf, the peak distribution P1 or P2 is formed to have an aluminum concentration of 15 atomic % or more and the maximum aluminum concentration Cmax.

The charge storage layer 6 contains the hafnium aluminate in which the aluminum is added to the hafnium oxide, but may contain various compounds described above so as to have the concentration distribution of such a low valence material. That is, the charge storage layer 6 contains compounds, in which the low valence materials are added to hafnium oxide or zirconium oxide, so as to have the energy band as illustrated in FIG. 3 and the concentration distribution as illustrated in FIG. 4.

In the semiconductor memory device 100 of the first embodiment, the charge storage layer 6 may contain a compound in which the low valence material such as aluminum is added to hafnium oxide or zirconium oxide. In addition, such a low valence material may be formed so as to have a concentration of 15 atomic % or more and a maximum concentration Cmax in the peak distribution P located on the side of the tunnel film 7. When the charge storage layer 6 is provided under such conditions, charge storage efficiency of the charge storage layer 6 can be improved.

The reasons will be described below.

Figure 5:
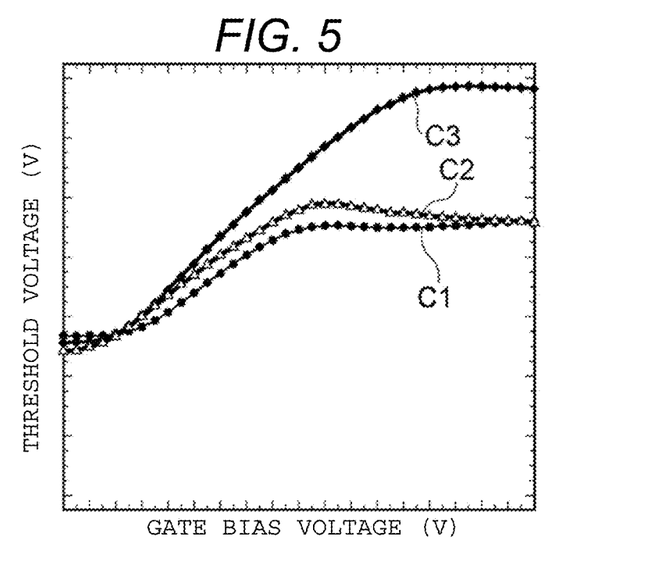
FIG. 5 is a graph illustrating electrical characteristics of the semiconductor memory device.

FIG. 5 is a graph illustrating electrical characteristics of the semiconductor memory device.

FIG. 5 illustrates a threshold voltage with respect to a gate bias voltage at the time of writing and erasing of the semiconductor memory device when the material of the charge storage layer is changed. In FIG. 5, a vertical axis represents the threshold voltage (V), and a horizontal axis represents the gate bias voltage (V). A curve C1 corresponds to a curve of a threshold voltage when the charge storage layer contains silicon nitride (SiN). A curve C2 corresponds to a curve of a threshold voltage when the charge storage layer contains hafnium oxide (HfO). A curve C3 corresponds to a curve of a threshold voltage when the charge storage layer contains hafnium aluminate (HfAlO).

Comparing the curves C1 to C3 in FIG. 5 to each other, the threshold voltage gradually increases as a write pulse voltage applied to a control gate voltage increases, and since written electrons exit toward the block film when a voltage pulse higher than a certain level is applied, the change in the threshold voltage is saturated. Thus, it is found that write saturation expands when the charge storage layer contains the hafnium aluminate.

Figure 6:
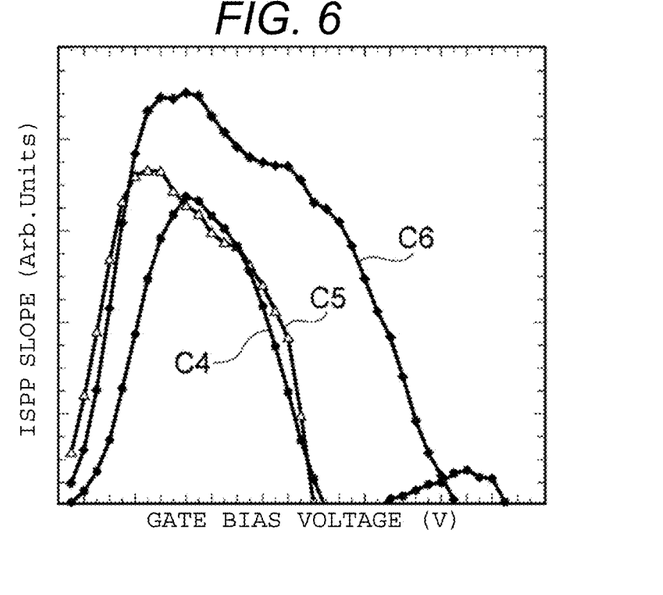
FIG. 6 is a graph illustrating electrical characteristics of the semiconductor memory device.

FIG. 6 is a graph illustrating electrical characteristics of the semiconductor memory device.

FIG. 6 illustrates a curve indicating an ISPP (incremental step pulse programming) slope at the time of writing in the semiconductor memory device when the material of the charge storage layer is changed. The ISPP is a method of applying pulses whose magnitude increases to measure a voltage shift and evaluating write characteristics and erase characteristics. In FIG. 6, a vertical axis represents the ISPP slope (arbitrary unit), and a horizontal axis represents the gate bias voltage (V). A curve C4 corresponds to a curve indicating an ISPP slope when the charge storage layer contains silicon nitride (SiN). A curve C5 corresponds to a curve indicating an ISPP slope when the charge storage layer contains hafnium oxide (HfO). A curve C6 corresponds to a curve indicating an ISPP slope when the charge storage layer contains hafnium aluminate (HfAlO).

Comparing the curves C4 to C6 in FIG. 6 to each other, in the curve C6, the ISSP slope increases more than the curves C4 and C5 as the gate bias voltage increases. Thus, write efficiency is improved when the charge storage layer contains the hafnium aluminate. Accordingly, charges are easily trapped in the charge storage layer and the write characteristics of the semiconductor memory device is improved.

A method of fabricating the semiconductor memory device according to the first embodiment will be described.

FIGS. 7A and 7B to 11A and 11B, and FIG. 12 are cross-sectional views illustrating the method of fabricating the semiconductor memory device 100 according to the first embodiment. Regions in FIGS. 7A and 7B to 11A and 11B, and FIG. 12 correspond to the region illustrated in FIG. 2.

Figure 7A:
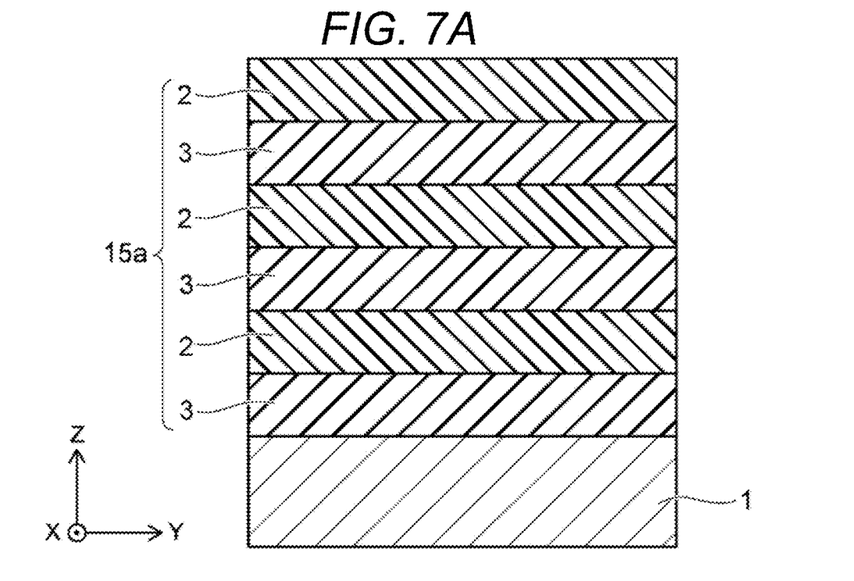
FIG. 7A and FIG. 7B are cross-sectional views illustrating a method of fabricating the semiconductor memory device according to the first embodiment.

First, as illustrated in FIG. 7A, insulating layers 3 and sacrifice layers 2 may be alternately stacked on a semiconductor substrate 1 in the Z direction by, for example, an ALD (Atomic Layer Deposition) method or a CVD (Chemical Vapor Deposition) method, thereby forming a stacked body 15a. The semiconductor substrate 1 is a monocrystalline silicon substrate, for example. The sacrifice layer 2 may be formed of, for example, silicon nitride, and the insulating layer 3 may be formed of silicon oxide, for example.

Figure 7B:
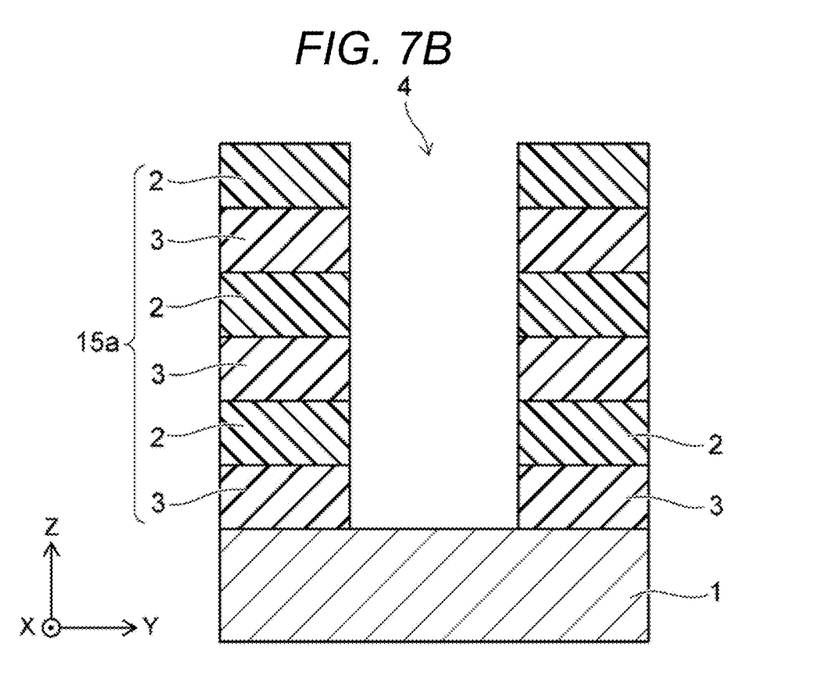

Next, as illustrated in FIG. 7B, a memory hole 4 may be formed in the stacked body 15a by, for example, an RIE (Reactive Ion Etching) method. The memory hole 4 may penetrate through the stacked body 15a and reach the semiconductor substrate 1. By the formation of the memory hole 4, a part of the semiconductor substrate 1, a part of the sacrifice layer 2, and a part of the insulating layer 3 may be exposed. A plurality of memory holes 4 may be formed in a lattice shape, for example, when viewed in the Z direction.

Figure 8A:
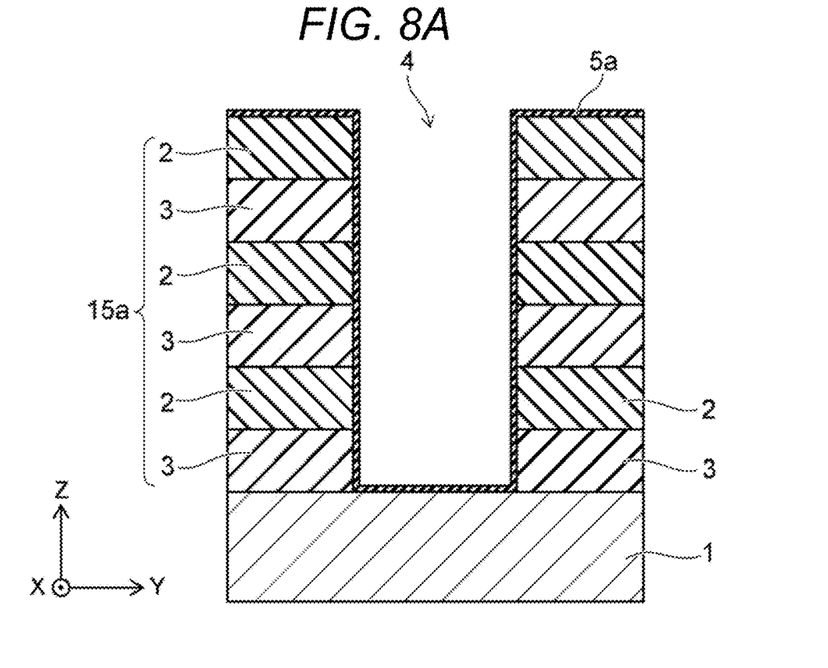
FIG. 8A and FIG. 8B are cross-sectional views illustrating a method of fabricating the semiconductor memory device according to the first embodiment.

Next, as illustrated in FIG. 8A, a block film 5a may be formed on an inner surface of the memory hole 4, by which the semiconductor substrate 1, the sacrifice layer 2, and the insulating layer 3 are exposed, by the ALD method or the CVD method, for example. The block film 5a may be formed on the uppermost insulating layer 3 of the stacked body 15a. The block film 5a may be formed of silicon oxide, for example.

Figure 8B:
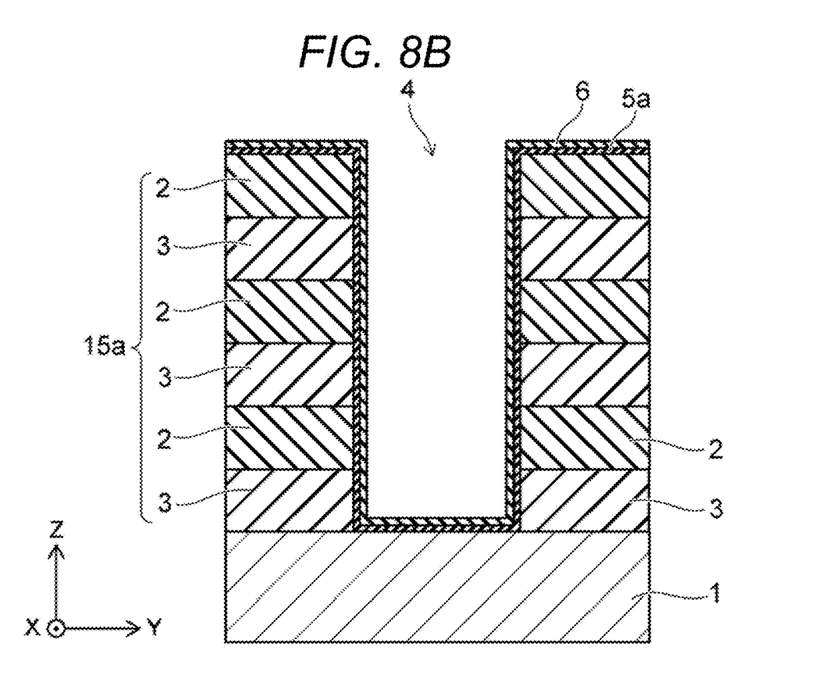

Subsequently, as illustrated in FIG. 8B, a charge storage layer 6 is formed on the block film 5a inside the memory hole 4. The charge storage layer 6 is also formed on the block film 5a located on the stacked body 15a.

The charge storage layer 6 may be formed of a compound, in which a low valence material is added to hafnium oxide or zirconium oxide, by the ALD method or the CVD method, for example. For example, the charge storage layer 6 may be formed of hafnium oxide added with aluminum having a concentration of 15 atomic % or more. The charge storage layer 6 containing such a compound may have crystallinity, and may be formed so as to have the energy band as illustrated in FIG. 3 and the concentration distribution as illustrated in FIG. 4.

For example, the charge storage layer 6 may be formed of hafnium aluminate, in which hafnium oxide films and aluminum oxide films are alternately stacked, so as to have the aluminum concentration distribution as illustrated in FIG. 4, by the ALD method.

Figure 9A:
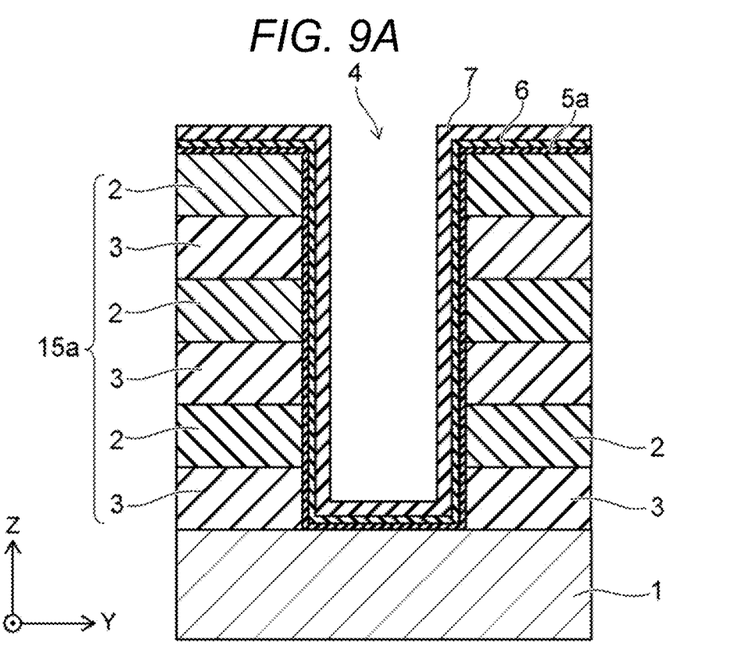
FIG. 9A and FIG. 9B are cross-sectional views illustrating a method of fabricating the semiconductor memory device according to the first embodiment.

Next, as illustrated in FIG. 9A, a tunnel film 7 may be formed on the charge storage layer 6 inside the memory hole 4 by the ALD method or the CVD method, for example. The tunnel film 7 is also formed on the charge storage layer 6 located on the stacked body 15a.

The tunnel film 7 may be formed of a stacked material of silicon nitride and silicon oxide by a band-gap operation, for example. When the charge storage layer 6 is formed of the hafnium aluminate, as illustrated in FIG. 4, the peak distribution P having the aluminum concentration of 15 atomic % or more and the maximum aluminum concentration Cmax may be located on the side of the tunnel film 7.

Figure 9B:
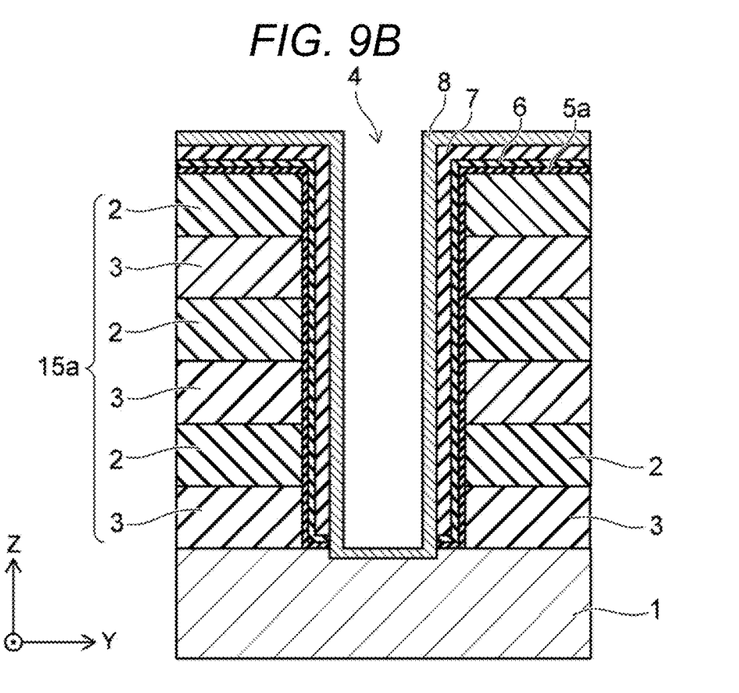

Next, as illustrated in FIG. 9B, a channel film 8 may be formed on the tunnel film 7 inside the memory hole 4 by the CVD method, for example. The channel film 8 is also formed on the tunnel film 7 located on the stacked body 15a. The channel film 8 may be formed of amorphous silicon, for example.

Subsequently, after the channel film 8, the tunnel film 7, the charge storage layer 6, and the block film 5a located on the bottom surface of the memory hole 4 may be removed by, for example, the RIE method. In some embodiments, a part of the semiconductor substrate 1 exposed by the removal is also removed.

Subsequently, as illustrated in FIG. 9B, the channel film 8 is formed again on the semiconductor substrate 1 and on the tunnel film 7 inside the memory hole 4. Thereafter, the amorphous silicon may be crystallized by, for example, annealing.

Figure 10A:
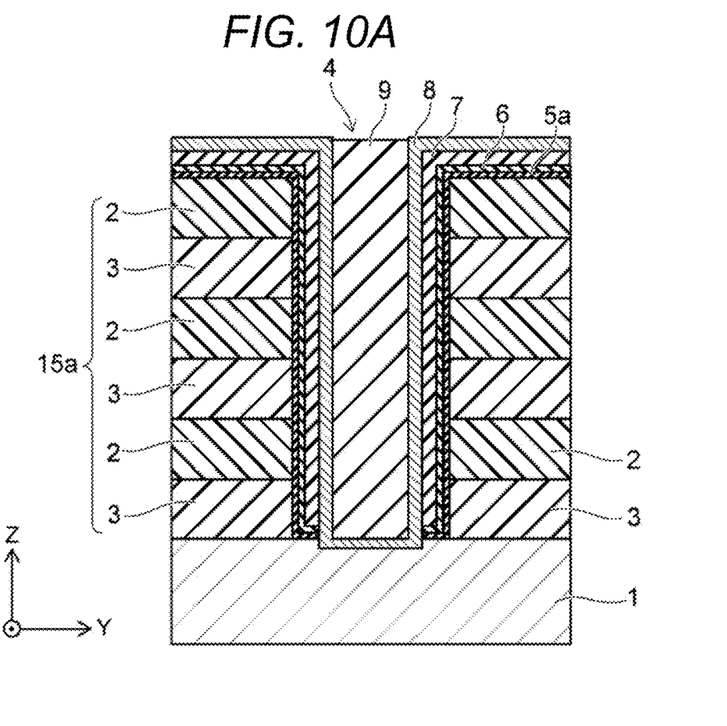
FIG. 10A and FIG. 10B are cross-sectional views illustrating a method of fabricating the semiconductor memory device according to the first embodiment.

Next, as illustrated in FIG. 10A, a core film 9 may be formed on the channel film 8 inside the memory hole 4 by the ALD method or the CVD method, for example. The core film 9 may be formed of silicon oxide, for example.

Figure 10B:
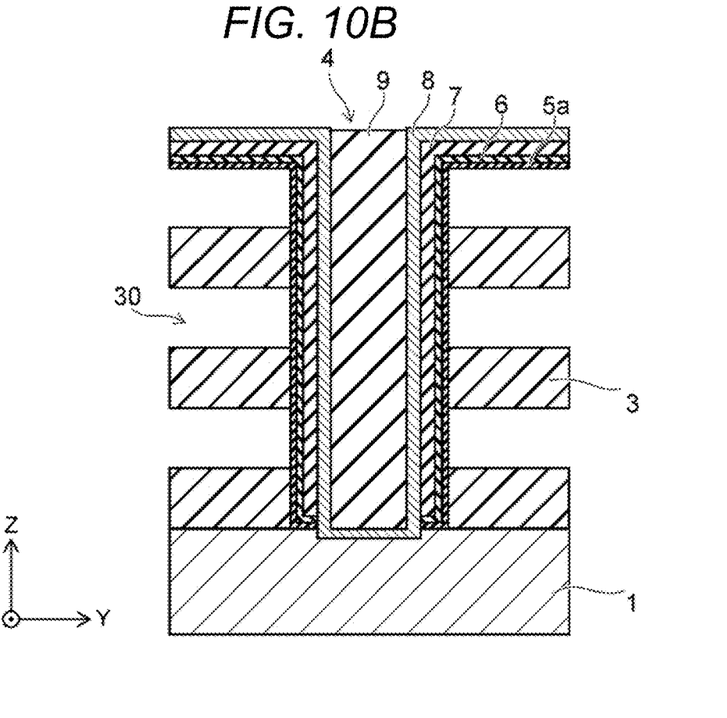

Next, as illustrated in FIG. 10B, a slit ST (see FIG. 1) extending in the X direction and the Z direction may be formed in the stacked body 15a by the RIE method, for example. Such a slit ST may penetrate through the stacked body 15a in the Z direction and reach the semiconductor substrate 1.

Subsequently, as illustrated in FIG. 10B, the sacrifice layer 2 of the stacked body 15a may be selectively removed via the slit ST by a wet etching method, for example. By the removal of the sacrifice layer 2, a cavity 30 is formed in the stacked body 15a. For example, when the sacrifice layer 2 is formed of the silicon nitride, phosphoric acid may be used as an etchant for wet etching. The block film 5a may function as an etching stopper and protect the charge storage layer 6 from etching.

Figure 11A:
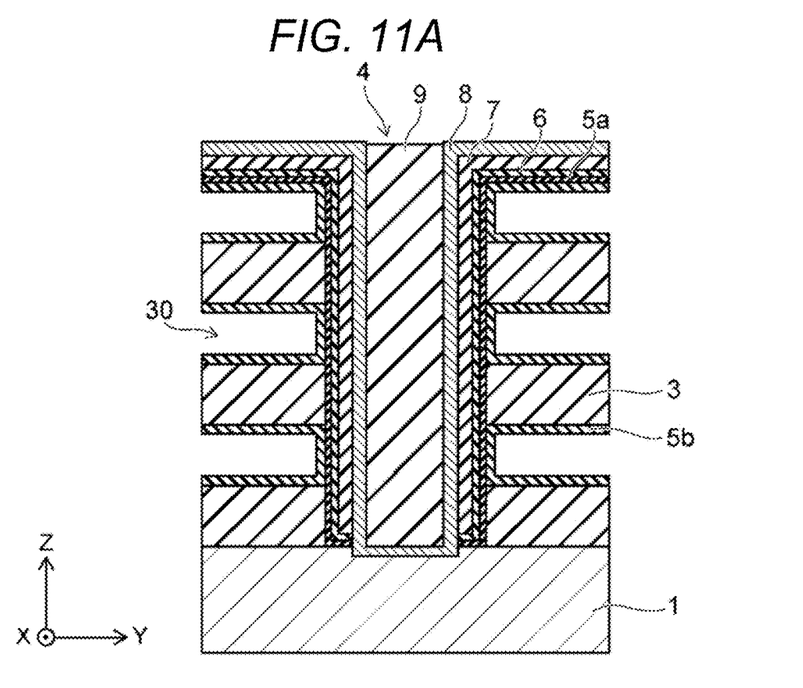
FIG. 11A and FIG. 11B are cross-sectional views illustrating a method of fabricating the semiconductor memory device according to the first embodiment.

Next, as illustrated in FIG. 11A, a block film 5b may be formed on an inner surface of the cavity 30 by the ALD method or the CVD method, for example. The block film 5b may be formed of aluminum oxide, for example. The block film 5b may be formed of at least one of zirconium oxide, hafnium oxide, or lanthanum oxide.

Figure 11B:
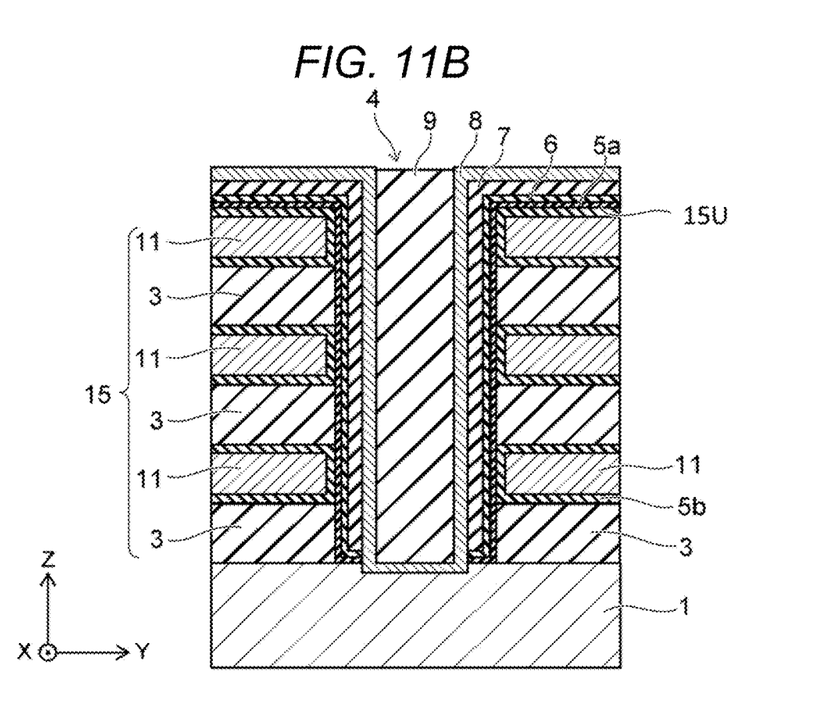

Next, as illustrated in FIG. 11B, an electrode layer 11 may be formed on the block film 5b by the ALD method or the CVD method, for example. For example, the electrode layer 11 may be formed of a stacked material of titanium nitride or tungsten or a combination thereof. In addition, a stacked body 15 having the plurality of electrode layers 11 and the plurality of insulating layers 3 may be formed.

Figure 12:
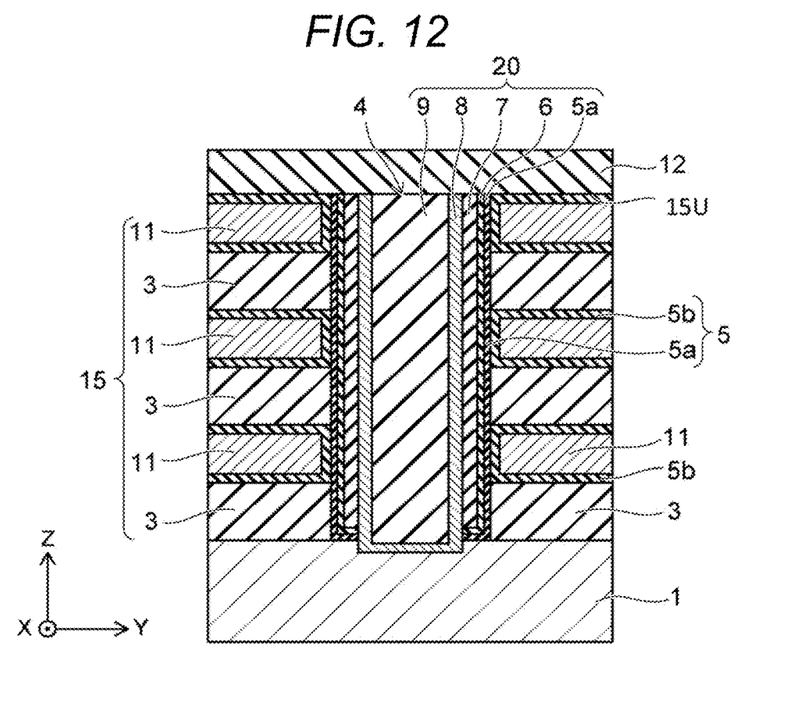
FIG. 12 is a cross-sectional view illustrating a method of fabricating the semiconductor memory device according to the first embodiment.

Next, as illustrated in FIG. 12, the block film 5a, the charge storage layer 6, the tunnel film 7, the channel film 8, and the core film 9 located on the stacked body 15 may be removed by the RIE method or a CMP (Chemical Mechanical Polishing) method, for example, and an upper surface 15U of the stacked body 15 is flattened. Thus, a columnar portion 20 having the core film 9, the channel film 8, the tunnel film 7, the charge storage layer 6, and the block film 5a may be formed. A block film 5 having the block film 5a and the block film 5b may be formed.

Subsequently, silicon oxide may be deposited on the upper surface 15U of the stacked body 15 by the CVD method, for example, and thus an insulating layer 12 can be formed. Thereafter, contacts and bit lines connected to the channel film 8 may be formed by a well-known method.

In this way, the semiconductor memory device 100 according to the first embodiment is fabricated.

According to the semiconductor memory device 100 of the first embodiment, charge storage efficiency of the charge storage layer 6 is improved. The reasons will be described below.

In the semiconductor memory device having the three-dimensional structure, the thickness of the charge storage layer is made thin, and thus the memory cell is miniaturized, whereby the number of memory cells can be increased. On the other hand, since the number of charges to be trapped in the charge storage layer depends on the film thickness, when the charge storage layer is formed thin, the charges are hardly trapped in the charge storage layer. For example, when the charge storage layer includes a silicon nitride film, the charges are difficult to be trapped by film-thinning and the charge storage efficiency is reduced. Thus, operation characteristics of the memory cell such as the write operation or the erasing operation deteriorate.

In the first embodiment, the semiconductor memory device 100 is provided with the charge storage layer 6 containing the compound in which the low valence material such as aluminum is added to the hafnium oxide or the zirconium oxide. Further, the low valence material of the charge storage layer 6 may be formed to have the concentration of 15 atomic % or more and the maximum concentration Cmax in the peak distribution P located on the side of the tunnel film 7. When such a charge storage layer 6 is provided, the charge storage efficiency of the charge storage layer 6 can be improved.

According to the first embodiment, the semiconductor memory device with the improved memory cell characteristics and the method of fabricating the same are provided.

Figure 13:
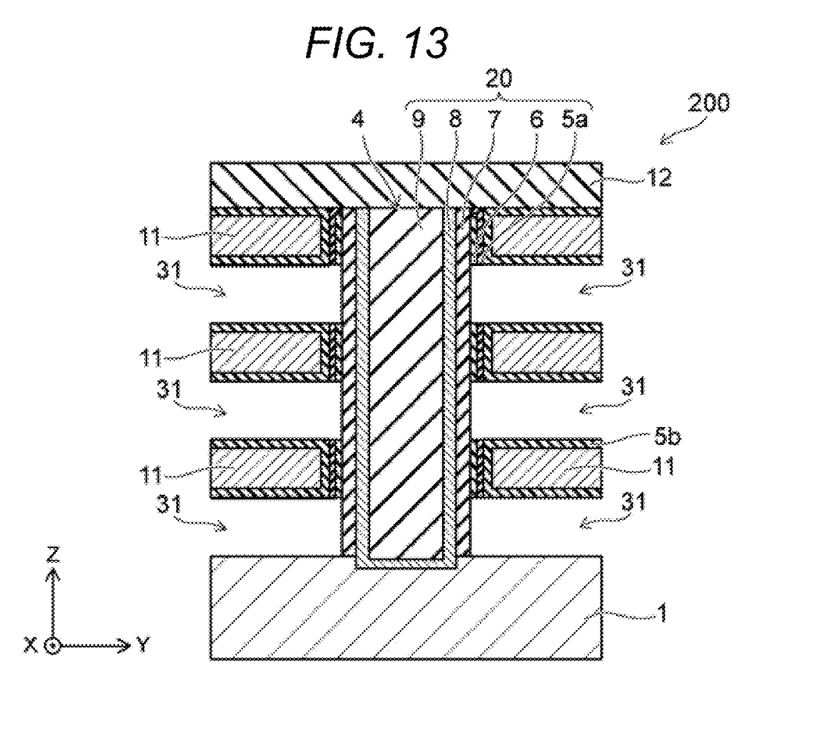
FIG. 13 is a cross-sectional view illustrating a semiconductor memory device according to a second embodiment.

FIG. 13 is a cross-sectional view of a semiconductor memory device 200 according to a second embodiment.

A region illustrated in FIG. 13 corresponds to the region illustrated in FIG. 2.

The semiconductor memory device 200 according to the second embodiment differs from the semiconductor memory device 100 according to the first embodiment in that cavities 31 are provided instead of the insulating layer 3. Since the configuration of the second embodiment is similar to that of the first embodiment except for the cavities 31, a detailed description of other components will not be presented.

As illustrated in FIG. 13, the semiconductor memory device 200 is provided with the cavities 31.

In the Z direction, a block film 5a and a charge storage layer 6 are located between the cavities 31. That is, the block film 5a and the charge storage layer 6 are divided in the Z direction. In some embodiments, in the Z direction, a tunnel film 7 may be located between the cavities 31, so that the tunnel film 7 is divided in the Z direction.

The second embodiment has the same effect as in the first embodiment.

While certain embodiments have been described, these embodiments have been presented byway of example only, and are not intended to limit the scope of the present disclosure. Indeed, the embodiments described herein may be embodied in a variety of other forms; furthermore, various omissions, substitutions and changes in the form of the embodiments described herein may be made without departing from the spirit of the present disclosure. The accompanying claims and their equivalents are intended to cover such forms or modifications as would fall within the scope and spirit of the present disclosure.

What is claimed is:

1. A semiconductor memory device comprising:
   a stacked body having a plurality of electrode layers stacked to be spaced apart from each other;
   a semiconductor portion, provided in the stacked body, extends in a first direction as the plurality of electrode layers are stacked;
   a first insulating film provided between the plurality of electrode layers and the semiconductor portion;
   a charge storage layer provided between the plurality of electrode layers and the first insulating film and containing a compound including at least one of hafnium oxide or zirconium oxide and a first material having a valence lower than that of the at least one of the hafnium oxide or the zirconium oxide; and
   a second insulating film provided between the plurality of electrode layers and the charge storage layer,
   wherein the first material has a maximum concentration of 15 atomic % or more,
   and wherein the maximum concentration is located closer to the first insulating film side than the second insulating film side.

2. The semiconductor memory device according to claim 1, wherein
   the first material is at least one of aluminum, yttrium, scandium, lanthanum, praseodymium, gadolinium, dysprosium, ytterbium, or lutetium.

3. The semiconductor memory device according to claim 1, wherein
   the valence is an oxidation number.

4. The semiconductor memory device according to claim 1, wherein
   gaps are provided between the plurality of electrode layers adjacent to each other in the first direction.

5. The semiconductor memory device according to claim 1, wherein
   the gaps divide the charge storage layer in the first direction.

6. The semiconductor memory device according to claim 1, wherein
   an upper end of a valence band of the charge storage layer is lower than an upper end of a valence band of the first insulating film.

7. The semiconductor memory device according to claim 1, wherein the charge storage layer is a single layer including the first material.

8. A method of fabricating a semiconductor memory device, comprising:
   forming a stacked body by alternately stacking first layers and insulating layers on a semiconductor substrate in a first direction;
   forming a through-hole in the stacked body, extending in the first direction, and reaching the semiconductor substrate;

forming a first insulating film on an inner wall of the through-hole;

forming a charge storage layer, which contains at least one of hafnium oxide or zirconium oxide and a first material having a valence lower than that of the at least one of the hafnium oxide or the zirconium oxide, on the first insulating film inside the through-hole; and forming a second insulating film on the charge storage layer inside the through-hole, wherein the first material has a maximum concentration of 15 atomic % or more, and wherein the charge storage layer is formed such that the maximum concentration is located closer to the first insulating film side than the second insulating film side.

9. The method of fabricating the semiconductor memory device according to claim 8, wherein the first material is at least one of aluminum, yttrium, scandium, lanthanum, praseodymium, gadolinium, dysprosium, ytterbium, or lutetium.

10. The method of fabricating the semiconductor memory device according to claim 8, wherein the valence is an oxidation number.

11. The method of fabricating the semiconductor memory device according to claim 8, further comprising:

providing gaps between the plurality of electrode layers adjacent to each other in the first direction.

12. The method of fabricating the semiconductor memory device according to claim 11, wherein the gaps divide the charge storage layer in the first direction.

13. The method of fabricating the semiconductor memory device according to claim 8, wherein an upper end of a valence band of the charge storage layer is lower than an upper end of a valence band of the first insulating film.

14. The method of fabricating the semiconductor memory device according to claim 8, wherein the charge storage layer is a single layer including the first material.

* * * * *